United States Patent [19]
Nozuyama et al.

[11] Patent Number: 5,189,675
[45] Date of Patent: Feb. 23, 1993

[54] SELF-DIAGNOSTIC CIRCUIT FOR LOGIC CIRCUIT BLOCK

[75] Inventors: Yasuyuki Nozuyama, Tokyo; Akira Nishimura, Kanagawa, both of Japan

[73] Assignee: Kabushiki Kaisha Toshiba, Kawasaki, Japan

[21] Appl. No.: 834,988

[22] Filed: Feb. 14, 1992

Related U.S. Application Data

[63] Continuation of Ser. No. 370,036, Jun. 22, 1989, abandoned.

[30] Foreign Application Priority Data

Jun. 22, 1988 [JP] Japan .................. 63-154017

[51] Int. Cl.$^5$ .................................. H04B 17/00
[52] U.S. Cl. .................. 371/22.3; 371/15.1; 371/22.1
[58] Field of Search ............ 371/22.3, 22.1, 22.4, 371/22.5, 22.6, 15.1, 21.3, 27, 21.1

[56] References Cited

U.S. PATENT DOCUMENTS

| | | | |
|---|---|---|---|
| Re. 33,368 | 10/1990 | Darling et al. | 371/15.1 |
| 3,786,431 | 1/1974 | Bouchet et al. | 371/15.1 |
| 3,961,254 | 6/1976 | Cavaliere et al. | 371/22.3 |
| 4,329,640 | 5/1982 | Reiner et al. | 324/73 R |
| 4,335,425 | 6/1982 | Goto et al. | 371/15.1 |
| 4,521,885 | 6/1985 | Melocik et al. | 371/15.1 |
| 4,554,664 | 11/1985 | Schultz | 371/22.3 |
| 4,583,041 | 4/1986 | Kimura | 371/24 |
| 4,710,931 | 12/1987 | Bellay et al. | 371/25 |
| 4,862,068 | 8/1989 | Kawashima et al. | 371/22.3 |
| 4,864,579 | 9/1989 | Kishida et al. | 371/22.3 |
| 4,879,718 | 11/1989 | Sanner | 371/22.3 |
| 4,887,267 | 12/1989 | Kanuma | 371/22.3 |
| 4,893,072 | 1/1990 | Matsumoto | 371/22.3 |
| 4,894,830 | 1/1990 | Kawai | 371/22.3 |
| 4,897,838 | 1/1990 | Tateishi | 371/22.3 |
| 4,912,395 | 3/1990 | Soto et al. | 371/22.3 |
| 4,916,388 | 4/1990 | Sano | 371/22.3 |
| 4,935,929 | 6/1990 | Sidman et al. | 371/22.3 |
| 4,942,577 | 7/1990 | Ozaki | 371/22.3 |
| 4,947,357 | 8/1990 | Stewart et al. | 371/22.3 |
| 4,995,039 | 2/1991 | Sakashita et al. | 371/22.3 |

FOREIGN PATENT DOCUMENTS 0181011 5/1986 European Pat. Off. .
2022319A 12/1979 United Kingdom .

Primary Examiner—Robert W. Beausolie
Assistant Examiner—Phung M. Chung
Attorney, Agent, or Firm—Foley & Lardner

[57] ABSTRACT

A self-diagnostic circuit comprises a plurality logic of circuits to be diagnosed and a plurality of first and second storage circuits provided for the logic circuits respectively. The first storage circuits have outputs which indicate whether or not the corresponding logic circuits are being diagnosed. The second storage circuits stored results of diagnoses of the corresponding logic circuits. The first and second storage circuits and logic circuits have a sequential diagnostic operation mode in which logic circuits are sequentially diagnosed according to a diagnosis starting signal, and a scan operation mode in which a specific one among the logic circuits is selected and diagnosed. The scan operation mode is realized during the supply of the diagnosis starting signal and by supplying selection signals that select the specific one among the logic circuits.

5 Claims, 3 Drawing Sheets

SELF-DIAGNOSTIC CIRCUIT FOR LOGIC CIRCUIT BLOCK

This application is a continuation of application Ser. No. 07/370,036, filed Jun. 22, 1989, now abandoned.

BACKGROUND OF THE INVENTION

1. Field of the Invention

The present invention relates to a self-diagnostic circuit for diagnosing logic circuit blocks of a VLSI, and particularly to a self diagnostic circuit that can select a particular one of the logic circuit blocks in order to diagnose the quality of the block.

2. Description of the Prior Art

It is generally known to incorporate a diagnostic circuit in a VLSI (very large scale integrated circuit) to self-diagnose logic circuit blocks of the VLSI with a simple signal input externally to the diagnostic circuit. As VLSIs become more integrated, complicated and functionally diverse, a self-diagnostic system that can diagnose such a VLSI more easily is required.

Generally, a self-diagnostic system for diagnosing a logic circuit is based on signature analysis. An output register of a circuit block to be diagnosed forms a linear feedback shift register (LFSR). A test pattern generator generates test patterns, which are applied to the circuit block to be diagnosed. Outputs of the circuit block are sequentially applied to the LFSR. This operation is called "signature compression." After the completion of a predetermined diagnostic sequence, the contents (signature of diagnosis) of the LFSR are compared with predetermined values to automatically diagnose the quality of the circuit block.

There are various forms for judging a result of self-diagnosis. For example, as described in the above, a VLSI chip incorporating a self-diagnostic circuit may have a comparison circuit that compares a result of self-diagnosis with a predetermined value. A self-diagnostic result based on the comparison is represented with a simple quality signal that is outputted to an upper level controller or externally of the VLSI chip.

Since it is not always necessary to implement the predetermined value on the chip, the self-diagnostic result may be stored in a register that is readable externally of the chip. Then, the quality judgment is carried out under higher level control such as machine language instruction program control, or with the use of an LSI tester.

The register for storing the self-diagnostic result may be a register different from output registers of the circuit blocks that have been self diagnosed, or the output registers of the circuit blocks that constitute an LFSR at the time of self-diagnosis may themselves be used as means for storing the diagnostic result. The reason for this is because the contents (signature) of the LFSR represent histories of patterns applied in the self-diagnosis. Therefore, it is common to use the output registers of the circuit blocks to be diagnosed as the means for storing the diagnostic result.

FIG. 1b is a block diagram showing a self-diagnostic circuit according to the prior art. The prior art self-diagnostic circuit comprises circuit blocks 1-1, 1-2 and 1-3 to be diagnosed, flip-flops (FFs) 2-1, 2-2 and 2-3 each of which has an output which indicates whether or not the diagnosis is being carried out, flip-flops (FFs) 3-1, 3-2 and 3-3 for storing diagnosis resultant data, OR gates 4-1, 4-2 and 4-3, and an AND gate 5.

In FIG. 1b, a reset signal R is inputted through an input line $l_1$, and a start signal ST is inputted through an input line $l_2$. End signals $EN_1$, $EN_2$ and $EN_3$ are outputted through output lines $l_3$, $l_4$ and $l_5$. "GOOD" resultant signals are outputted through lines $l_6$, $l_7$ and $l_8$. A self-diagnosis "GOOD" resultant signal G is outputted through a line $l_9$.

Each of the FFs 2-1 to 2-3 and 3-1 to 3-3 is a D-type FF as shown in FIG. 2a. According to a clock signal CLK, the FF latches "GOOD" resultant signals ($G_1$, $G_2$, $G_3$) provided through a terminal A. Further, according to the clock signal CLK, the FF outputs the latched start signal ST, end signals $EN_1$, $EN_2$, and "GOOD" resultant signals ($G_1$, $G_2$, $G_3$) through a terminal B. The clock signal CLK is not shown in FIG. 1b.

To carry out the self-diagnosis in the arrangement of FIG. 1b, the reset signal R (=1) is input to the blocks 1-1 to 1-3 through the line $l_1$ to initialize the circuit as a whole. Then, the FFs 2-1 to 2-3 and 3-1 to 3 3 are all reset. AT the same time, input registers, output registers, counters, etc., that are incorporated in the circuit blocks 1-1 to 1-3 but not shown in the figure are reset.

After that, the reset signal R is returned to 0. The start signal ST (=1) is input through the line $l_2$ so that the diagnosis may be started for the circuit block 1-1. A terminal B of the FF 2-1 outputs the signal 1 to self-diagnose the circuit block 1-1 according to a signature analyzing method, etc.

After the completion of the diagnosis of the circuit block 1-1, the block 1-1 outputs the end signal $EN_1$ and "GOOD" resultant signal $G_1$. Here, "$G_1 = 1$" represents "GOOD" while "$G_1 = 0$" represents "NO GOOD." The same applies to the signals $G_2$ and $G_3$. Then, the resultant signal $G_1$ is latched by the FF 3-1, and the end signal $EN_1$ resets the FF 2-1 and starts the self-diagnosis of the circuit block 1-2.

In this way, the circuit blocks 1-1 to 1-3 are sequentially diagnosed. The "GOOD" resultant signals $G_1$, $G_2$ and $G_3$ are sequentially latched by the FFs 3-1 to 3-3. Unless the reset signal R is inputted, the statuses of the FFs 3-1 to 3-3 are kept as they are. The contents of the FFs 3-1 to 3-3 are input to the AND gate 5.

The self-diagnosis end signal $EN_3$ of the circuit block 1-3 will be an overall self-diagnosis end signal. This end signal EN 3 and an overall "GOOD" resultant signal G ($G_1 G_2 G_3$) are sent to an upper level control block (not shown) in the VLSI to complete the self-diagnostic operation.

The upper level control block judges that all the circuit blocks that have been self diagnosed are normal if G=1 (i.e., $G_1 = 1$, $G_2 = 1$ and $G_3 = 1$), while the upper level control block judges that some of the circuit blocks are faulty if G=0.

There are many forms of self-diagnosis other than the conventional example mentioned in the above. For example, an output register of a certain circuit block to be self-diagnosed may commonly be used as an input register of the next circuit block to be diagnosed. If there are many (N pieces) circuit blocks to be self diagnosed, it is not necessary to provide a diagnosis execution indicating flip-flop (FF) for each of the N circuit blocks. Instead, it is possible to decode outputs of about $\log_2 N$ numbers of FFs to indicate the execution of diagnosis. It is also possible to use only one FF to indicate the parallel execution of self-diagnoses of a plurality of circuit blocks. These superficial variations are not essential to the present invention, and the present invention is applicable to these variations.

According to the conventional self-diagnostic system described above, the circuit blocks are sequentially diagnosed. Namely, they are diagnosed in a go-or-no-go way. Accordingly, the conventional system is not appropriate for analyzing the quality of complicated logic circuits and not sufficient to carry out a complicated self-diagnosis.

In addition, the conventional diagnostic system cannot directly select a specific one among the circuit blocks but it will sequentially diagnose all the circuit blocks including the specific one.

As VLSIs become further integrated, complicated and functionally diverse, the self-diagnostic sequence is unavoidably complicated and expanded. Therefore, if the diagnostic sequence is disturbed in a certain block, diagnoses of the following blocks may be hindered to cause a serious problem.

SUMMARY OF THE INVENTION

To solve the problem mentioned above, an object of the present invention is to provide a self-diagnostic system that can select a specific one among the circuit blocks to diagnose the specific circuit block in order to effectively diagnose a plurality of the circuit blocks.

In order to accomplish the object, the present invention provides a self-diagnostic circuit for diagnosing logic circuit blocks. The self diagnostic circuit comprises a plurality of circuit blocks to be diagnosed, a plurality of first storage portions provided for storing information indicating the execution of diagnosis of the circuit blocks, and second storage portions for storing results of diagnoses of the circuit blocks. The first and second storage portions and circuit blocks have a sequential diagnostic operation mode in which the circuit blocks are sequentially diagnosed according to a diagnosis starting signal, and a selective diagnosis mode in which a specific one among the circuit blocks is selected and diagnosed. The selective diagnosis mode is realized after supplying the logical value of the diagnosis starting signal and scan-in data with which the specific circuit block is separately selected and diagnosed, using a scan operation mode.

The first and second storage portions and circuit blocks are connected in a predetermined order in a scan chain circuit. In the scan operation mode, the storage portions and circuit blocks in the scan chain circuit are scanned, and data for selectively starting the diagnosis of the specific circuit block or selectively putting the specific circuit block under an execution state are set in the first and second storage portions and circuit blocks to selectively diagnose the specific circuit block.

These and other objects, features and advantages of the present invention will be more apparent from the following detailed description of preferred embodiments in conjunction with the accompanying drawings.

BRIEF DESCRIPTION OF THE DRAWINGS

FIG. 1b is a schematic diagram a flip-flop (FF) shown in FIG. 1a;

FIG. 2b is a schematic diagram showing a flip-flop (FF) shown in FIG. 2a; and

DETAILED DESCRIPTION OF THE EMBODIMENTS

Figure 2A:
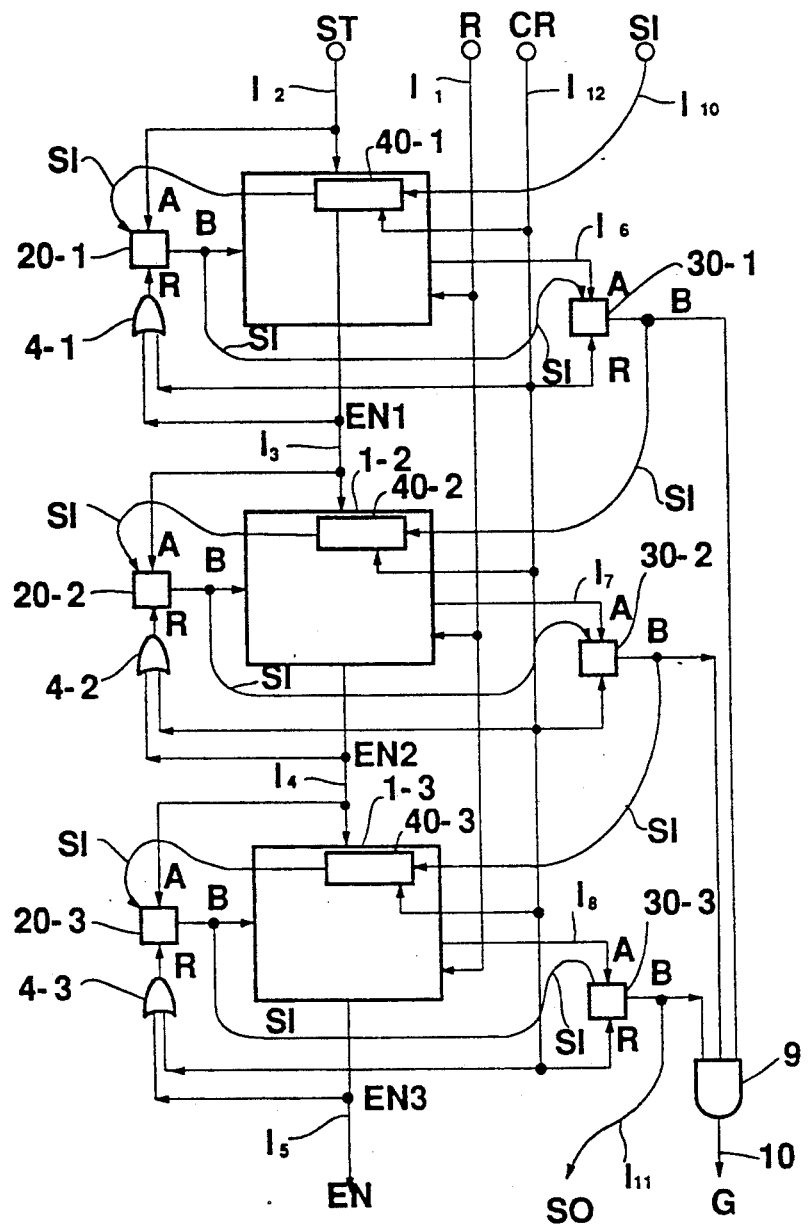
FIG. 2a is a block diagram showing a self-diagnostic circuit according to an embodiment of the invention.
Figure 2B:
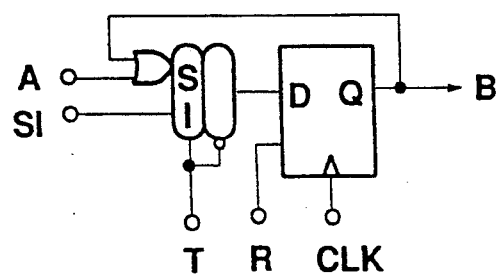

FIG. 2a is a block diagram showing a self-diagnostic circuit according to an embodiment realizing a self-diagnostic method of the invention. FIG. 2b is a view showing the details of a flip-flop (FF) shown in FIG. 2a.

In FIG. 2a, the self-diagnostic circuit comprises circuit blocks 1-1 to 1-3 to be diagnosed, flip-flops (FFs) 20-1 to 20-3 each indicating whether or not a diagnosis is under execution, flip-flops (FFs) 30 1 to 30-3 each storing diagnosis resultant data, OR gates 4-1 to 4-3, and an AND gate 9. The circuit blocks 1-1 to 1-3 incorporate circuits 40-1 to 40-3, respectively. Each of the circuits 40-1 to 40-3 comprises a diagnostic input pattern generating circuit and an end signal generating circuit that outputs an end signal ($EN_1$, $EN_2$ or $EN_3$) for indicating the end of a diagnostic sequence.

In addition to the sequential diagnostic operation mode explained with reference to FIG. 1a of the prior art, the embodiment has a selective diagnosis mode for selectively diagnosing a specific circuit block. To realize the selective diagnosis mode, there is a scan operation mode. The FFs 20-1 to 20-3, FFs 30-1 to 30-3 and diagnostic input pattern generating and end signal generating circuits 40-1 to 40-3 are scanned according to a selection signal comprising a scan operation mode signal T to be described later to set the FFs and diagnostic input pattern generating and end signal generating circuits so that, after the scan operation mode is turned off, a specific one of the circuit blocks 1-1 to 1-3 will selectively be diagnosed.

Figure 1B:
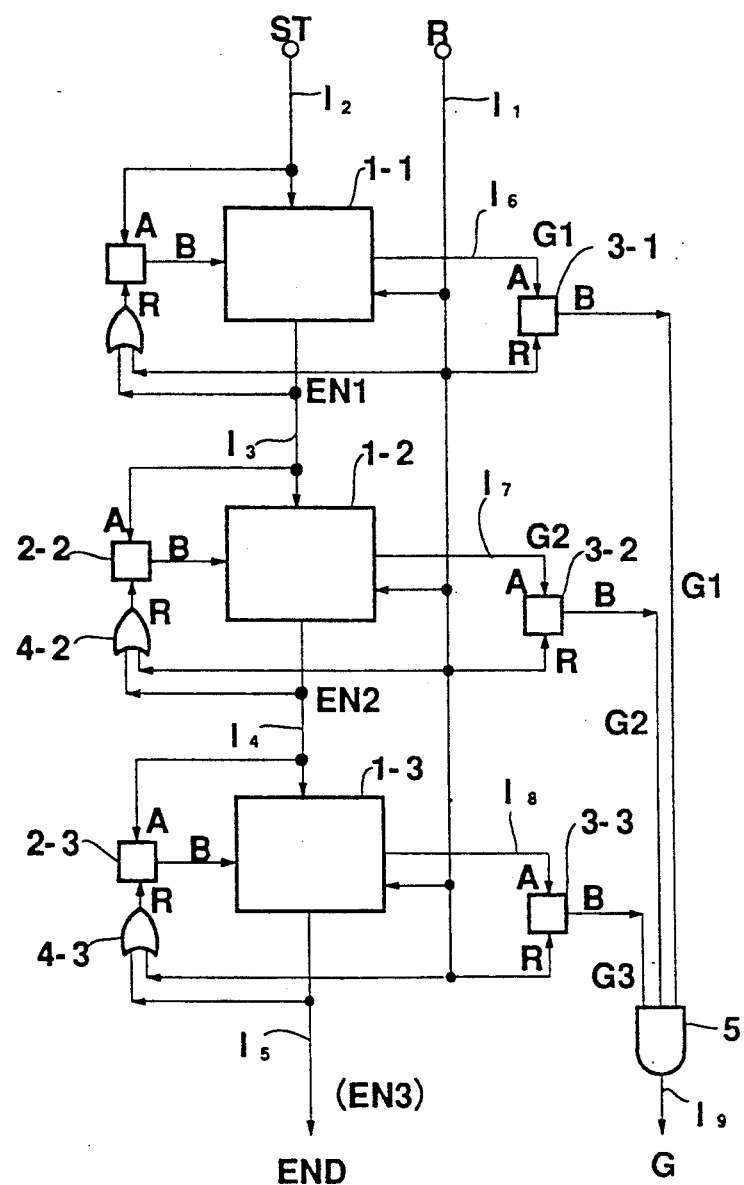

Each of the FFs 20-1 to 20-3 and 30-1 to 30-3 is constituted as shown in FIG. 2b. When the scan operation mode signal T is 0, the FFs operate in the same manner as the D-type FFs shown in FIG. 1b. When the scan operation mode signal T is 1, the FFs receive the scan in data SI and output the scan-in data SI from terminals B of the FFs at the rising edge of the clock signal CLK.

In connection with the FF shown in FIG. 2b, if the scan-in data SI is 1, if the with the scan operation mode signal T being 1 and if the clock signal CLK is changed from 0 to 1, the FF will take in the value 1 of the scan-in data SI, and it hold the value (SI=1) if the scan operation mode signal T is changed to 0 before the clock signal CLK is next changed from 0 to 1. Then, a circuit block corresponding to the FF (20-1, 20-2 or 20-3) that is holding the value 1 will be diagnosed.

To scan the FFs and circuit blocks with the scan-in data SI, a scan chain circuit connects the FFs and circuit blocks in the order of the diagnostic input pattern generating and end signal generating circuit 40-1, FF 20-1, FF 30-1, FF 30-2, the diagnostic input pattern generating and end signal generating circuit 40-3, FF 20-3 and FF 30-3.

Figure 1A:
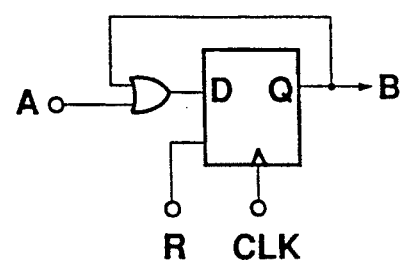
FIG. 1a is a block diagram showing a self-diagnostic circuit according to a prior art.

Unlike the prior art shown in FIG. 1a, the embodiment employs two kinds of reset signals. Namely, a signal CR resets or initializes the FFs 20-1 to 20-3 and 30 1 to 30-3 and the diagnostic input pattern generating and end signal generating circuits 40-1 to 40-3 included in the scan chain, and a reset signal R initializes or resets the circuit blocks 1-1 to 1-3 to start the self-diagnosis.

Like numerals represent like elements and like input-/output lines in FIGS. 1a and 2a. The circuit of the embodiment shown in FIG. 2a additionally includes a line $l_{10}$ for inputting the scan-in data SI, a line $l_{11}$ for outputting a scan-out data SO, and a line $l_{12}$ for inputting the reset signal CR.

In FIG. 2a, the terminals shown in FIG. 2b for inputting the scan operation mode signal T and clock signal CLK are not shown for the sake of simplicity.

The operation of this embodiment now will be explained.

When the scan operation mode signal T is set to 0 and when the reset signals R and CR are simultaneously turned on (i.e., set to 1) they set to 1 to initialize the circuit as a whole. After that these signals are turned off. Then, a starting signal ST may be set to 1 to start the self-diagnostic sequence. Under this situation, similar to the prior art shown in FIG. 1a, the circuit blocks 1-1 to 1-3 are sequentially diagnosed. Since the operation is the same as that of the prior art, it will not be repeatedly explained.

In addition to the sequential diagnosis, the present invention is capable of diagnosing a particular one of the circuit blocks, for instance, the circuit block 1-3. This will be explained now.

The scan operation mode signal T is supplied to each of the FFs 20-1 to 20-3 and 30-1 to 30-3 and the diagnostic input pattern generating and end signal generating circuits 40-1 to 40-3 are set to 1 to establish the scan operation mode. The reset signal R is set to 1, signal CR is set to 0 and required scan-in data SI is externally supplied for every clock cycle through the line $l_{10}$. The scan in data SI sequentially scan the diagnostic input pattern generating and end signal generating circuits 40-1 to 40-3 and FFs 20-1 to 20-3 and 30-1 to 30-3 in the order of the scan chain mentioned before. When the FFs 20-1 to 20-3 are set to 0, 0 and 1, respectively, the FFs 30-1 to 30-3 to 1, 1 and 0, respectively, and the diagnostic input pattern generating and end signal generating circuits 40-1 to 40-3 to proper initial values, the scan operation mode signal T may be set to 0 so that those values are held in the FFs 20-1 to 20-3 and 30-1 to 30-3 and diagnostic input pattern generating and end signal generating circuits 40-1 to 40-3. Particularly, the FF 20-3 will hold the value of 1. Then, self-diagnosis of the circuit block 1-3 corresponding to the FF 20-3 is carried out. A diagnosis "GOOD" resultant signal $G_3$ from the circuit block 1-3 is fetched by the FF 30-3. Since the FFs 30-1 and 30-2 each have held 1, the signal $G_3$ from an output of the FF 30-3 will cause the AND gate 9 to output an overall diagnosis "GOOD" resultant signal G.

In this way, this embodiment can freely set various input signals to diagnose each circuit block independently of the other circuit blocks. The result of each diagnosis can be easily understood by carrying out a predetermined number of diagnostic clock cycles having been set under the scan operation mode and by checking the signal G that indicates a result of the diagnosis.

In this embodiment, the FFs 30-1 to 30-3 have been employed to store results of diagnoses. Instead of the FFs 30-1 to 30-3, a register may be employed to store more detailed results of diagnoses. Just after the completion of self-diagnosis of each circuit block, a value of an output register or of a part of it, for the diagnosed circuit block may be transferred to the register that substitutes for the FFs, to store the result of the diagnosis therein. In this case, the lines $l_6$, $l_7$ and $l_8$ may be diagnostic result transfer lines (single or plural), and the FFs 30-1 to 30-3 may be diagnostic result storing registers.

In the above case, it is preferable to read the contents ("GOOD" signals $G_1$ to $G_3$ each represented by an array of plural bits) of the respective registers separately. It is not meaningful to provide a simple "GOOD" signal from $G_1$ to $G_3$, as was seen in the prior art.

If the diagnostic result storing means is a register, the AND gate 9 is not needed. This register for storing the diagnostic result may be a normal register or may be an LFSR having serial or parallel inputs. If the LFSR is used, results of all diagnoses can be handled with the single register.

Figure 3:
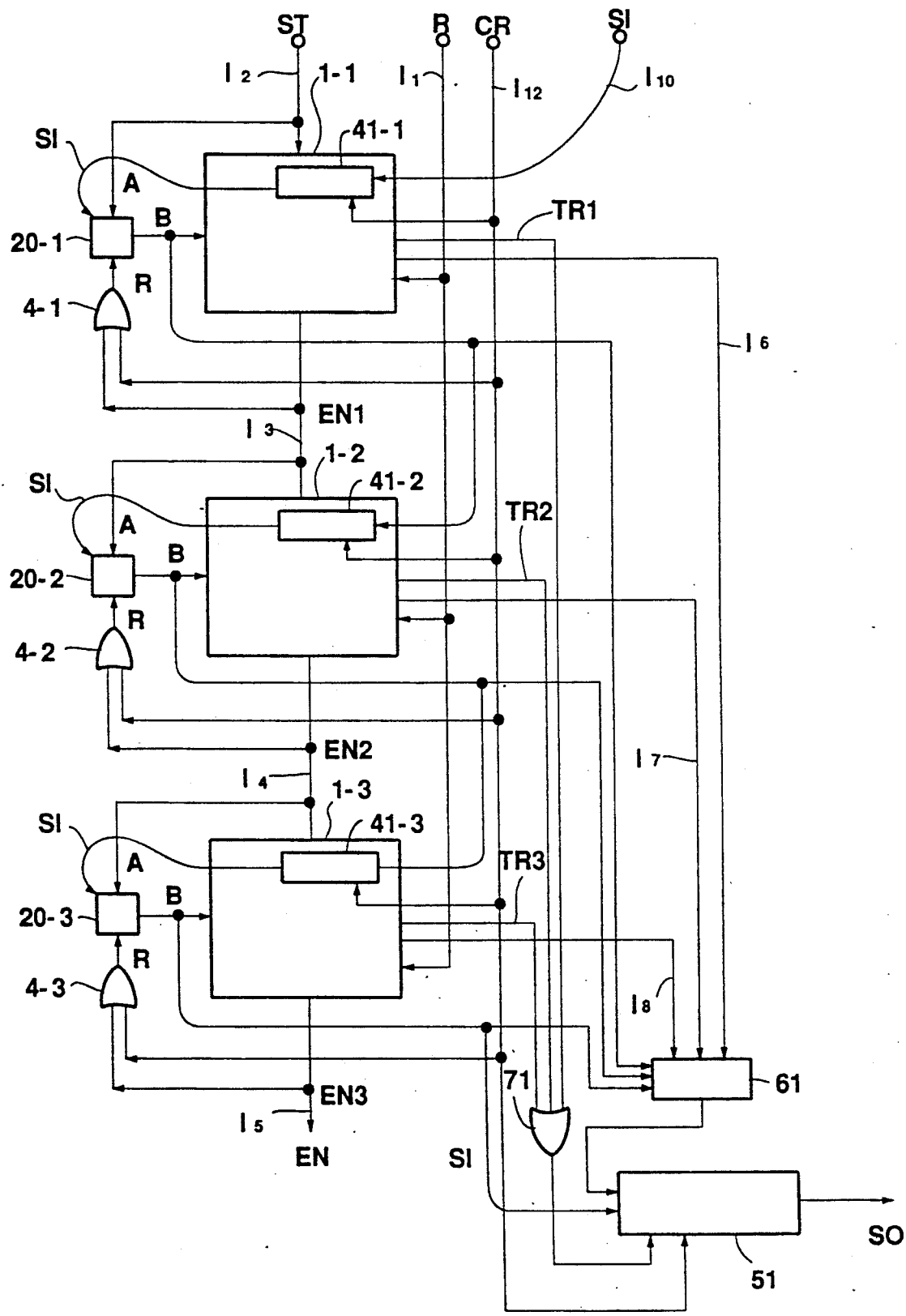
FIG. 3 is a block diagram showing a modification of the self-diagnostic circuit of the invention.

FIG. 3 is a view showing another embodiment of the invention, in which the diagnostic result storing means is a linear feedback shift register (LFSR) 51 with serial inputs. In this embodiment, results of diagnoses of respective circuit blocks are transferred to the LFSR 51 that is a storage unit for storing a final overall diagnostic result. A result of diagnosis of each circuit block is expressed with the contents (plural bits) of an output register of the circuit block in question. The transfer operation to the LFSR 51 is achieved in plural clock cycles. Due to this, a diagnostic result transfer signal generating circuit is needed in addition to an end signal generating circuit. In FIG. 3, these two kinds of circuits and a diagnostic input pattern generating circuit are contained in each of circuits represented with numerals 41-1 to 41-3. Diagnostic result transfer signals of the circuit blocks are represented with reference marks $TR_1$ to $TR_3$, respectively. Reference marks $l_6$ to $l_8$ are transfer lines of the diagnostic results of the circuit blocks.

These transfer signals shall become 1 during the time period necessary for the transfer to an activate writing operation with respect to the LFSR 51. Generally, this requires very small circuit addition. For example, if a diagnostic input pattern is provided by a count-up counter, a combination signal of proper bits of the counter or an overflow signal of the counter is generally used as an end signal, and also a transfer signal may be generated in the same manner.

A selector 61 of FIG. 3 selects data to be input to the LFSR from the transfer lines. A selection signal for the selector 61 is an output of a flip-flop (FF) that indicates an execution state of each diagnosis. (It is possible to omit some of the outputs of the FFs.) Therefore, in this embodiment, signals $EN_1$ to $EN_3$ that indicate the completion of respective diagnoses are activated after the completion of transfer of results of the diagnoses. To enable a read operation with a scan operation mode signal T=1, a feedback loop of the LFSR 51 is electrically cut off with the scan operation mode signal T (=1) so that the LFSR 51 may become a register that allows a normal scan operation. The signal T is not shown in FIG. 3.

The self-diagnostic according to the invention is applicable for logic circuit blocks that are controllable with microinstructions. The self-diagnosis under the control of microinstructions is somewhat special because a plurality of circuit blocks are diagnosed with a group of diagnostic microinstruction sequences. This technique basically requires only one flip-flop (FF) to indicate an overall execution state of the microinstruction diagnosis. Diagnosis of one circuit block may be distinguished from diagnoses of the other circuit blocks if the diagnostic microinstruction sequences are so formed to be clearly distinguished from each other. In this case, if initialization of each diagnostic sequence is done in the several initial steps of the sequence, it is easier to distinguish the sequences from each other.

With this sort of arrangement of the diagnostic microinstruction sequences, an address input register of a ROM for storing the microinstructions is provided to be scanned. Then, a first address of a certain diagnostic microinstruction sequence for a certain circuit block may be set according to a scanning operation. By executing the particular microinstruction sequence, the particular circuit block can be diagnosed independently of the other circuit blocks. The time duration for executing self-diagnosis of each microinstruction sequence is determined by the number of microloops. Namely, a microloop counter corresponds to a completion judging circuit for the diagnosis of each circuit block. If the microloop counter is caused to be scanned, it is possible to control the completion judging circuit.

To prevent an abnormality from occurring during the scanning operation, the output register of the ROM for storing the microinstruction may be controlled by using the scan operation mode signal T to output NOP (NO OPERATION) signals for a necessary period of time.

In summary, according to the present invention, a particular one among the circuit blocks can selectively be diagnosed independently of the other circuit blocks. In a self-diagnosis system based on microinstruction control, an input register of a ROM for storing microinstructions is scanned to carry out the microinstruction self-diagnosis from an optional address.

The self-diagnostic system of the present invention can be incorporated in a very large scale integrated circuit to effectively diagnose various logic blocks of the integrated circuit.

Various modifications will become possible for those skilled in the art after reviewing the teachings of the present disclosure without departing from the scope thereof.

What is claimed is:

1. A self-diagnostic circuit comprising:

a plurality of intercoupled logic circuits, each logic circuit of said logic circuits performing a self-diagnosis operation independent of each other and outputting information indicative of faulty/correct operation when said self-diagnosis operation is completed;

a plurality of first flip-flop circuits, each first flip-flop circuit of said first flip-flop circuits being coupled to a respective logic circuit of said logic circuits and having an output indicating that said respective logic circuit to which it is coupled is performing said self-diagnosis operation;

a plurality of second flip-flop circuits, each second flip-flop circuit of said second flip-flop circuits being coupled to a respective logic circuit of said logic circuits for responding to said respective logic circuit to which it is coupled for storing said information indicative of said faulty/correct operation;

a scanning path, including said plurality of first flip-flop circuits and said plurality of second flip-flop circuits and means for selectively enabling only a particular logic circuit of said logic circuits to perform a said self-diagnosis operation and wherein a particular first flip-flop of said first flip-flops, to which said particular logic circuit is coupled, has an output to indicate that said particular logic circuit is performing said independent self-diagnosis; and means, coupled to said second flip-flop circuits, for examining said second flip-flop circuits to determine if at least one second flip-flop circuit of said second flip-flop circuits is storing faulty/indication information of said information indicative of faulty correct information for said particular logic circuit and for outputting a signal indicating said faulty indication information is stored in said at least one second flip-flop circuit.

2. The self-diagnostic circuit as claimed in claim 1, wherein each logic circuit of said logic circuits includes a diagnostic input pattern generating and diagnostic end signal generating circuit responsive to scan-in data from said scanning path for setting a given diagnostic operation for said each logic circuit.

3. The self-diagnostic circuit as claimed in claim 2, further comprising:

a scan chain circuit for connecting said first and second flip-flop circuits and said logic circuits in a predetermined order, for carrying out a scanning operation under a scan operation mode and for setting data in said first and second flip-flop circuits and in said diagnostic input pattern generating and end signal generating circuits of said logic circuits for selectively executing and diagnosing only a specific logic circuit of said logic circuits and for releasing said scan operation mode for selectively executing and diagnosing said specific logic circuit of said logic circuits.

4. A self diagnostic circuit comprising:

(a) a plurality of logic circuits, connected in a given order to be diagnosed, each logic circuit of said logic circuits including a circuit for generating a diagnostic input pattern for said each logic circuit and an end signal generating circuit for generating an end signal from said logic circuit and said each logic circuit being diagnosed according to an end signal sent from a logic circuit of said logic circuits which is in a preceding location in said given order;

(b) a first storage circuit, coupled to said logic circuits, for storing information indicating that diagnosis of at least one logic circuit of said logic circuits is being executed;

(c) a second storage circuit, coupled to said logic circuits, for storing information of diagnostic results from said logic circuits, said first and second storage circuits receiving input signals for storage according to a scan operation mode signal; and (d) a scan chain circuit for connecting said first and second storage circuits and diagnostic input pattern generating and end signal generating circuits in a predetermined order, said scan chain circuit supplying scan-in data to said first and second storage circuits and to said diagnostic input pattern generating and end signal generating circuits for setting said scan-in data in said storage circuits and in said diagnostic input pattern generating and end signal generating circuits, said scan-in data being supplied through said scan chain circuit to said storage circuits and diagnostic input pattern generating and end signal generating circuits while a scan operation mode signal is supplied to said scan chain circuit, then, after said scan-in data is set in said storage circuits and diagnostic input pattern generating and end signal generating circuits, said scan operation mode signal is released, thus selectively causing diagnosis of a specific logic circuit of said logic circuits in response to said diagnostic input pattern generating circuit of said specific logic circuit and subsequent generation of said end signal from said end signal generating circuit of said specific logic circuit.

5. A self-test circuit comprising:

a plurality of logic circuit blocks each adapted to perform an independent self-test operation;

a plurality of first flip-flops, each of said first flip-flops controlling a corresponding one of said logic circuit blocks to carry out a said self-test operation;

a plurality of second flip-flops, each of said second flip-flops storing information indicative of faulty or correct operation of a corresponding one of said logic circuits, said one of said logic circuits providing said information upon completion of a said self-test operation;

a scanning path comprising first and second flip-flops connected in series in order to put one of said logic circuits at a time in a condition for carrying out a said independent self-test operation of a particular one of said logic circuits, by storing through said scanning path in said first flip-flops information controlling said particular one of said logic circuits to carry out a said self-test operation and inhibiting others of said logic circuits from carrying out a said self-test operation at the same time; and means for outputting a result of said self-test operation by examining if a said second flip-flop corresponding to said particular one of said logic circuits indicates faulty operation of said particular one of said logic circuits.

* * * * *